(12) United States Patent
Chan et al.

(10) Patent No.: US 6,400,257 B1
(45) Date of Patent: Jun. 4, 2002

(54) HIGH PERFORMANCE CMOS PSEUDO DYNAMIC BIT COMPARATOR WITH BYPASS FUNCTION

(75) Inventors: Yuen H. Chan, Poughkeepsie, NY (US); Anuj Kohli, Maple Grove, MN (US); John R. Rawlins, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/625,885

(22) Filed: Jul. 26, 2000

(51) Int. Cl.[7] .............................. G05B 1/00; G06F 7/02
(52) U.S. Cl. ...................... 340/146.2; 326/52
(58) Field of Search ................. 340/146.2; 326/112, 326/113, 52, 54

(56) References Cited

U.S. PATENT DOCUMENTS

| | | | | |
|---|---|---|---|---|
| 5,357,236 A | * | 10/1994 | McClure | 340/146.2 |
| 5,900,013 A | * | 5/1999 | Narayan et al. | 340/146.2 |
| 5,986,538 A | * | 11/1999 | Yoon | 340/146.2 |
| 6,014,074 A | * | 1/2000 | Park | 340/146.2 |
| 6,255,856 B1 | * | 7/2001 | Oh | 340/146.2 |

* cited by examiner

*Primary Examiner*—Tuan T. Lam
(74) *Attorney, Agent, or Firm*—Lynn L. Augspurger

(57) ABSTRACT

A high performance CMOS comparator circuit is integrated with a bypass function allowing comparing first and second data sets (A & B) with a high data width (more than 30 and illustrated as 48 bits). In many cases, it is often required to compare not only sets A&B but also set A with an additional bypass set, and the preferred circuit embodiment permits this to be achieved.

2 Claims, 10 Drawing Sheets

HIGH PERFORMANCE CMOS PSEUDO DYNAMIC BIT COMPARATOR WITH BYPASS FUNCTION

FIELD OF THE INVENTION

This invention relates to high performance CMOS comparators, and particularly to one which integrates a bypass function for improve performance.

TRADEMARKS

S/390 and IBM are registered trademarks of International Business Machines Corporation, Armonk, N.Y., U.S.A. Other names may be registered trademarks or product names of International Business Machines Corporation or other companies.

BACKGROUND

High speed CMOS circuits perform a wide bit compare function. A high performance comparator is needed for VLSI logic and memory applications which enables fast path delay and hence improves cycle time as needed in a microprocessor system. This is particularly important for wide bit comparators with very wide data widths (data widths in excess of 30 bits, sometimes as high as 40 to 50 bits). These comparators could easily consume 30–40% of total critical path delay budget of a computer system.

In existing practice, two comparator implementations are commonly known:

1.) Static comparators performance is limited by static circuits.
2.) Dynamic comparators disadvantage is in their dynamic circuit timing complexity.

In today's VLSI logic and memory applications, it is a difficult task to design high speed wide bit comparators (data width in excess of 30 bits). These comparators need to be extremely fast since they can consume 30–40% of critical path delay budget of a microprocessor system.

SUMMARY OF THE INVENTION

In accordance with our invention we provide a high performance CMOS comparator circuit with a bypass allowing comparing first and second data sets (A & B) with a high data width (more than 30 and illustrated as 48 bits). In many cases, it is often required to compare not only sets A&B but also set A with an additional bypass set, and the preferred circuit embodiment permits this to be achieved.

These and other improvements are set forth in the following detailed description. For a better understanding of the invention with advantages and features, refer to the description and to the drawings.

Our detailed description explains the preferred embodiments of our invention, together with advantages and features, by way of example with reference to the drawings.

Figure 1:
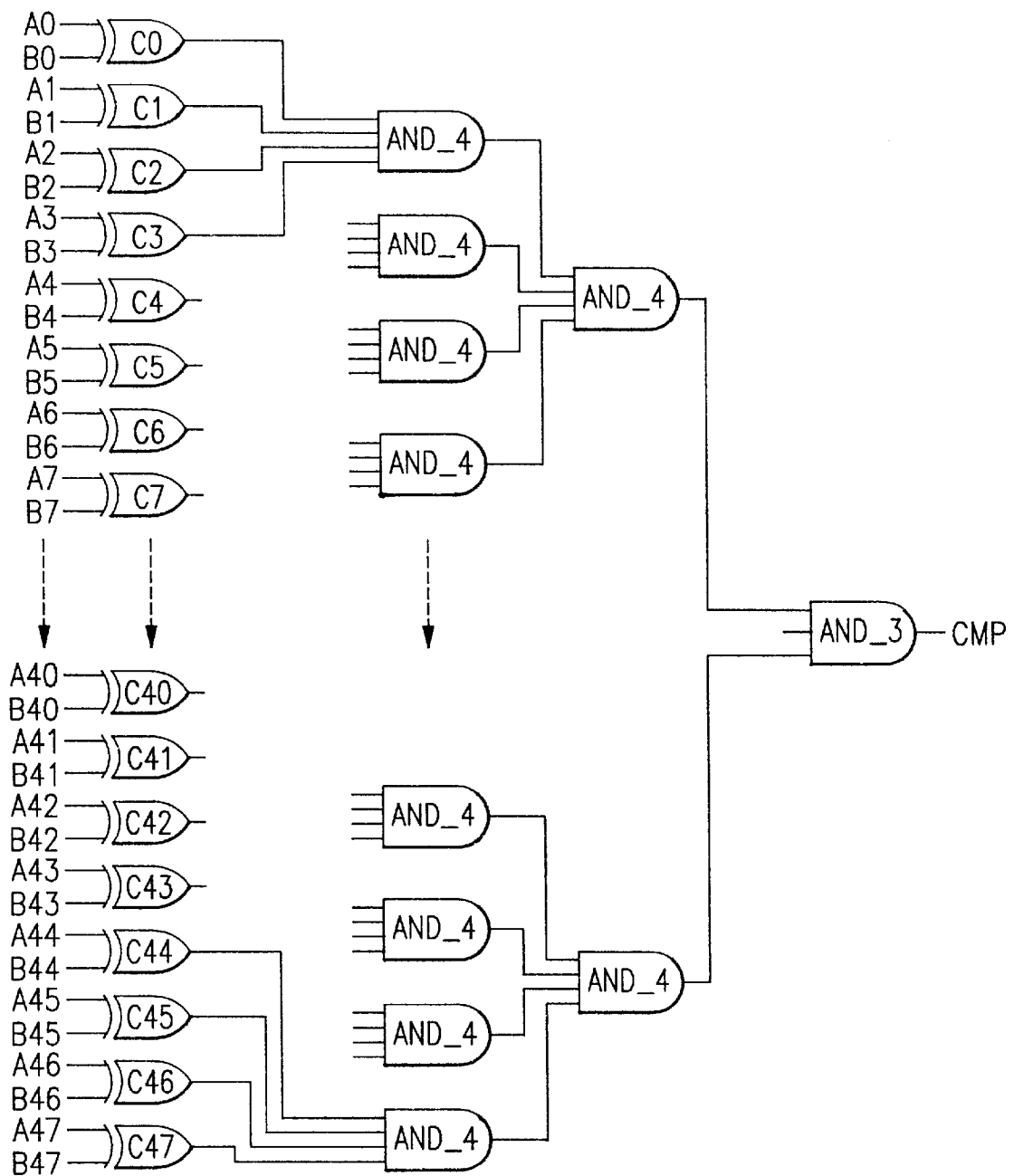
FIG. 1 illustrates an AND comparator.
Figure 1G:
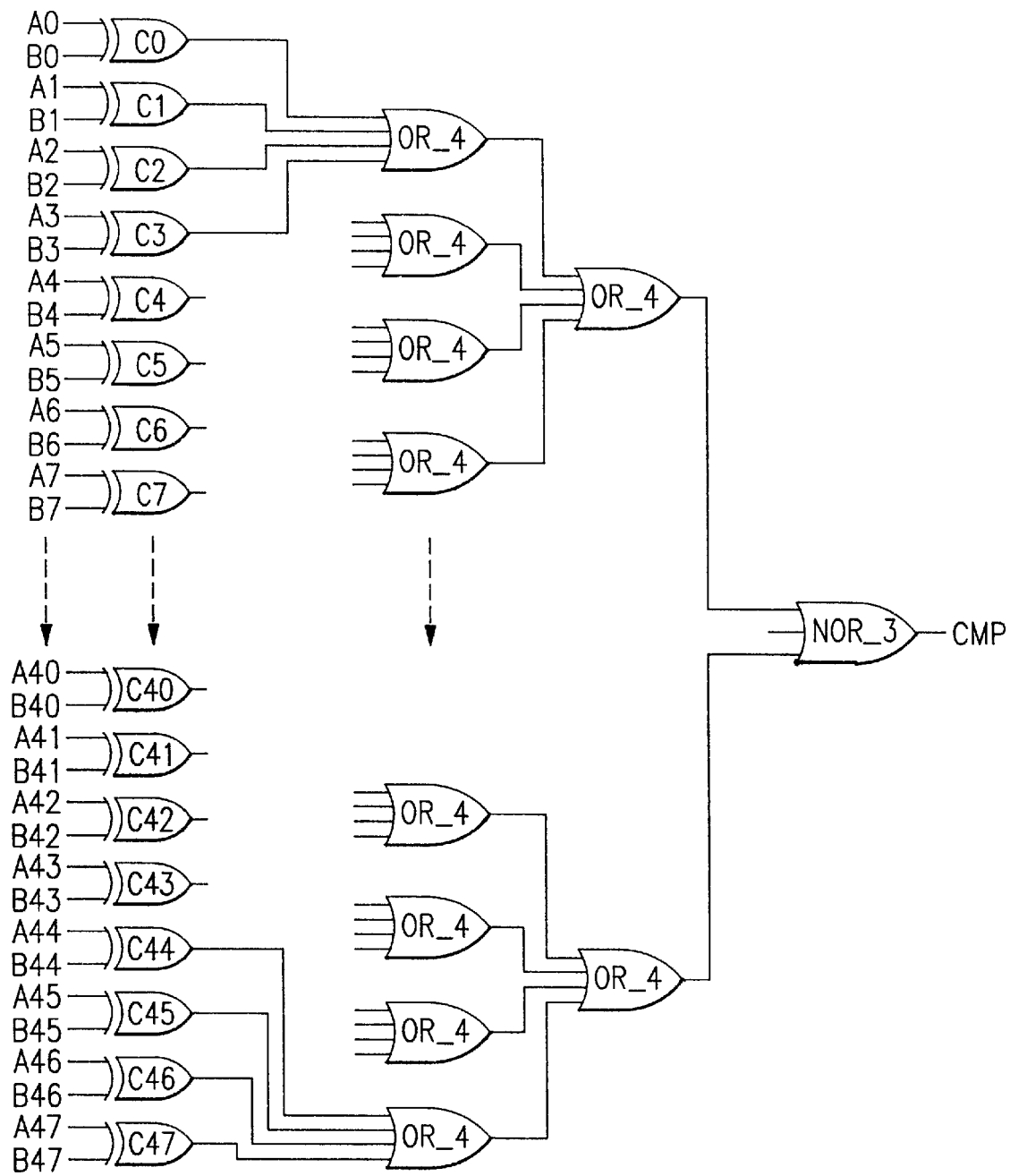
FIG. 1a illustrates an OR comparator.

For illustration purpose, a 48-bit comparator is shown in the following diagrams. FIG. 1 and FIG. 1a show two variations of the static approach. Both designs use conventional static XOR, AND and OR circuits with 4 cascaded stages to perform the compare function. The main problem of this type of design is its slow speed (due to 4 levels cascade logic and 4-input AND/OR circuits).

Figure 2:
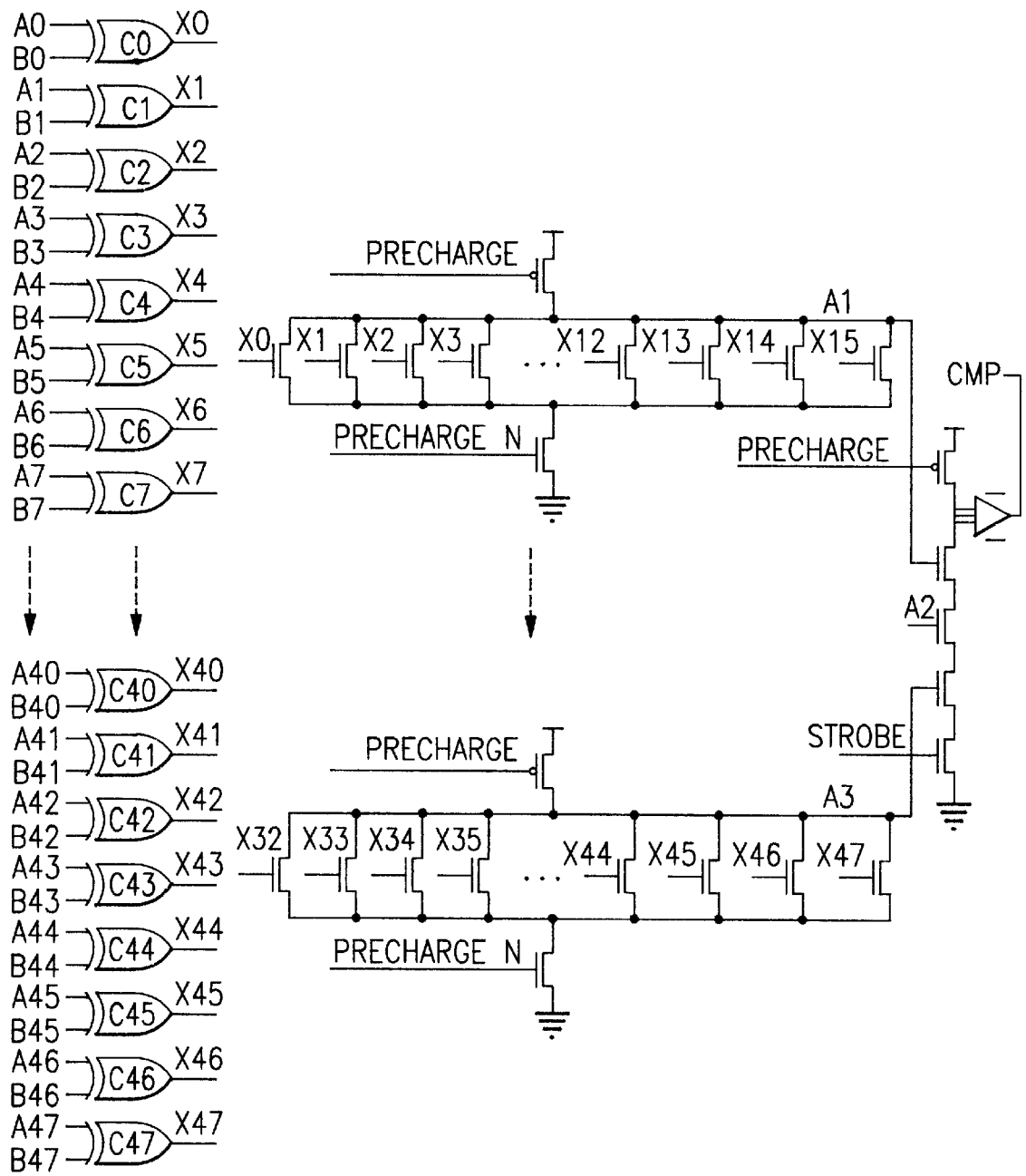
FIG. 2 illustrates a dynamic comparator.

A dynamic comparator is illustrated by FIG. 2.

This type of comparator requires both a PRECHARGE and a STROBE clocks. The precharge could lead to short path timing problems. Clock skew in the design could cause the comparator to precharge before a latch capturing the comparator's state has time to close. To avoid this type of problem padding is required. The padding costs extra delay which slows down the comparator. The STROBE could only be asserted after the XOR circuits have evaluated and therefore a race condition exists between XOR output and strobe signal. An early strobe signal will cause the comparator to functionally fail (CMP will always be high). Delaying the strobe adds dead time to the circuit delay. Due to its inherent timing complexities, this type of comparator is seldomly used.

Figure 3:
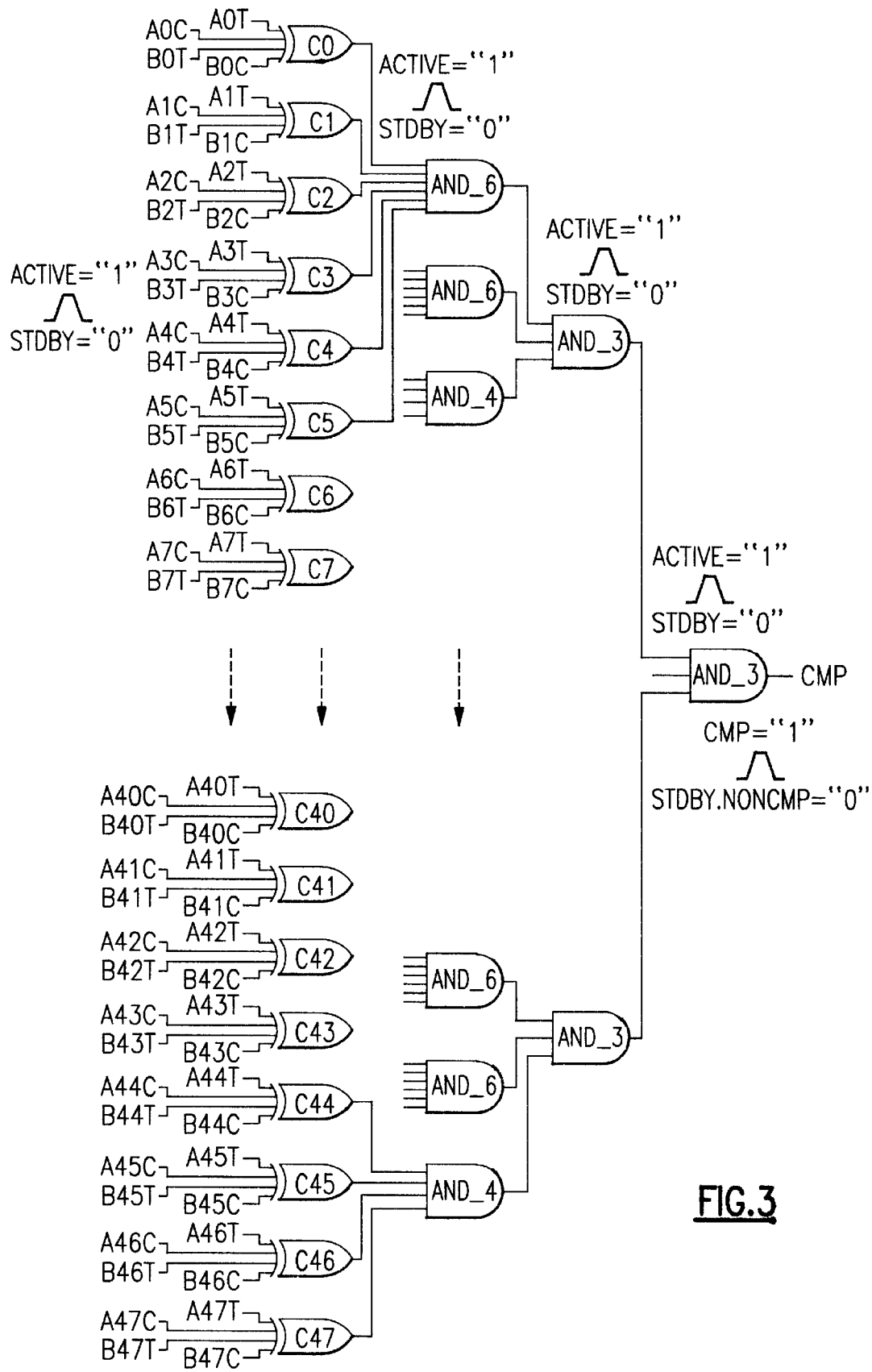
FIG. 3 illustrates a pseudo dynamic comparator.

This invention improves the high performance pseudo dynamic comparator shown in FIG. 3.

The FIG. 3 comparator is implemented using xor/and blocks similar to FIG. 1. This comparator is similar to the static comparator except it uses dual phase (ie, true and complement) dynamic input signals. An example of dual phase signals are those coming from sense-amplifier output (dynamic pulses) of an SRAM macro. Since inputs to the XOR bit comparators are dynamic pulses, therefore outputs of the XORs and the subsequent AND circuits are also dynamic. Hence the whole comparator operates in a dynamic fashion. Since the circuit topology of this comparator resembles that of a static design and yet it works with dynamic pulses throughout all the signal paths, it is therefore called a "pseudo dynamic" design. In this design, in order to achieve very high circuit performance, skewed P to N device strength ratios are needed. All XORs and AND circuits here are skewed in such a way that the leading edge of the pulse is extremely fast. Since the devices are skewed to enhance leading edge switching, the trailing edge delay is therefore slower and the pulse is stretched thru each stage of the logic. All pulses reset before the next cycle begins. This approach gives fast performance as the dynamic comparator but without the timing complexities. No explicit dynamic reset or strobe clocks are needed. For a given process technology, the Pseudo Dynamic design is about 20% faster than a comparable static design.

Figure 4:
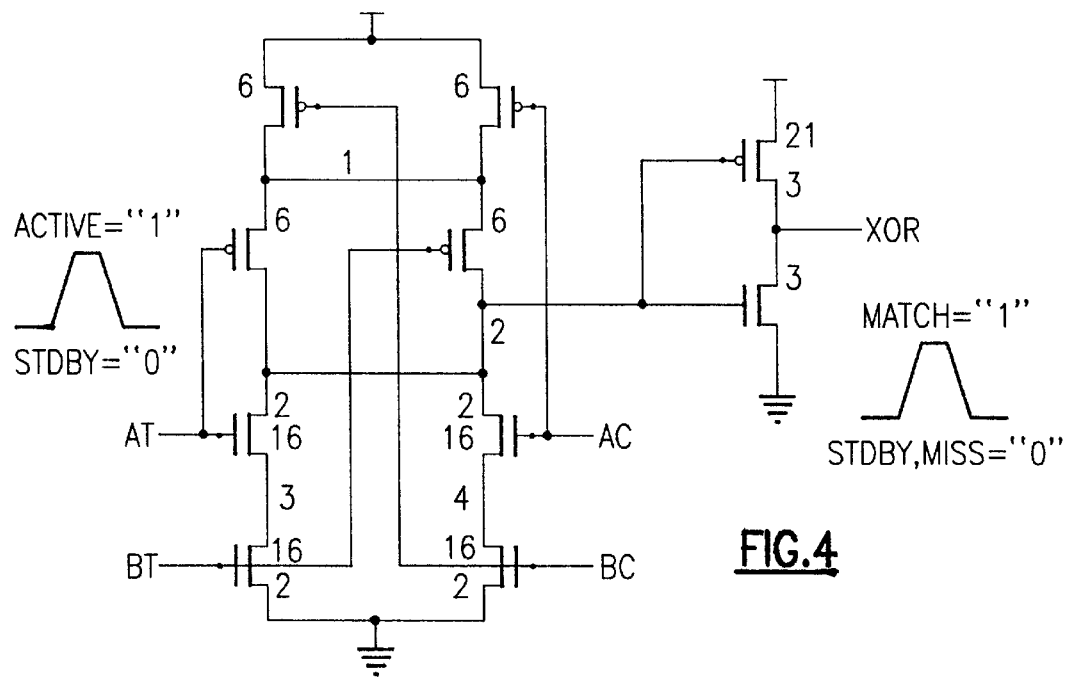
FIG. 4 illustrates a dual-phase input pseudo dynamic XOR bit comparator.
Figure 7:
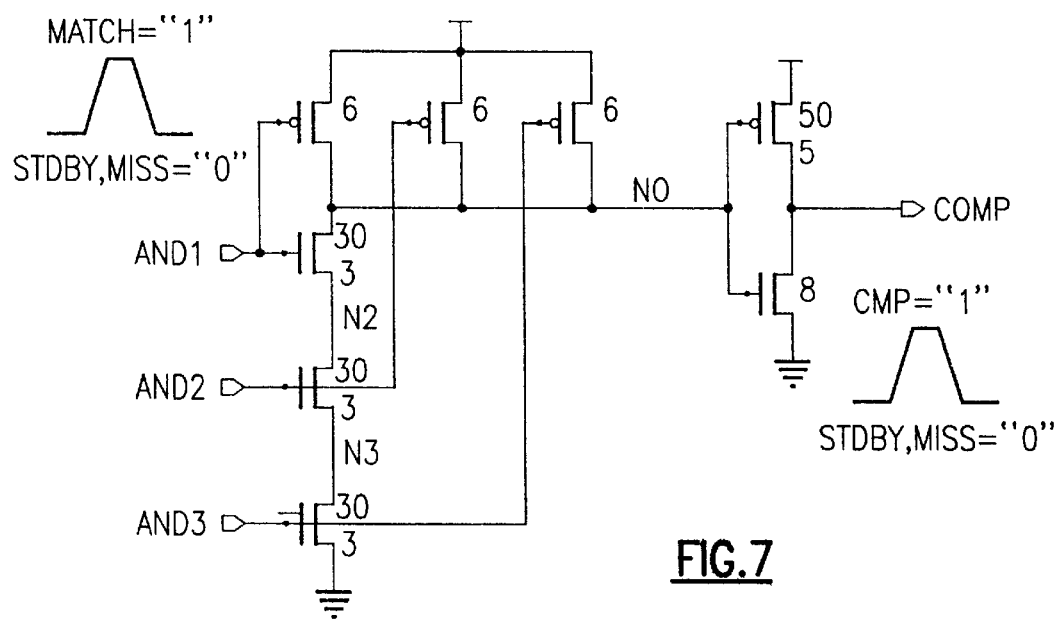
FIG. 7 illustrates a 3-way pseudo dynamic AND circuit.
Figure 5:
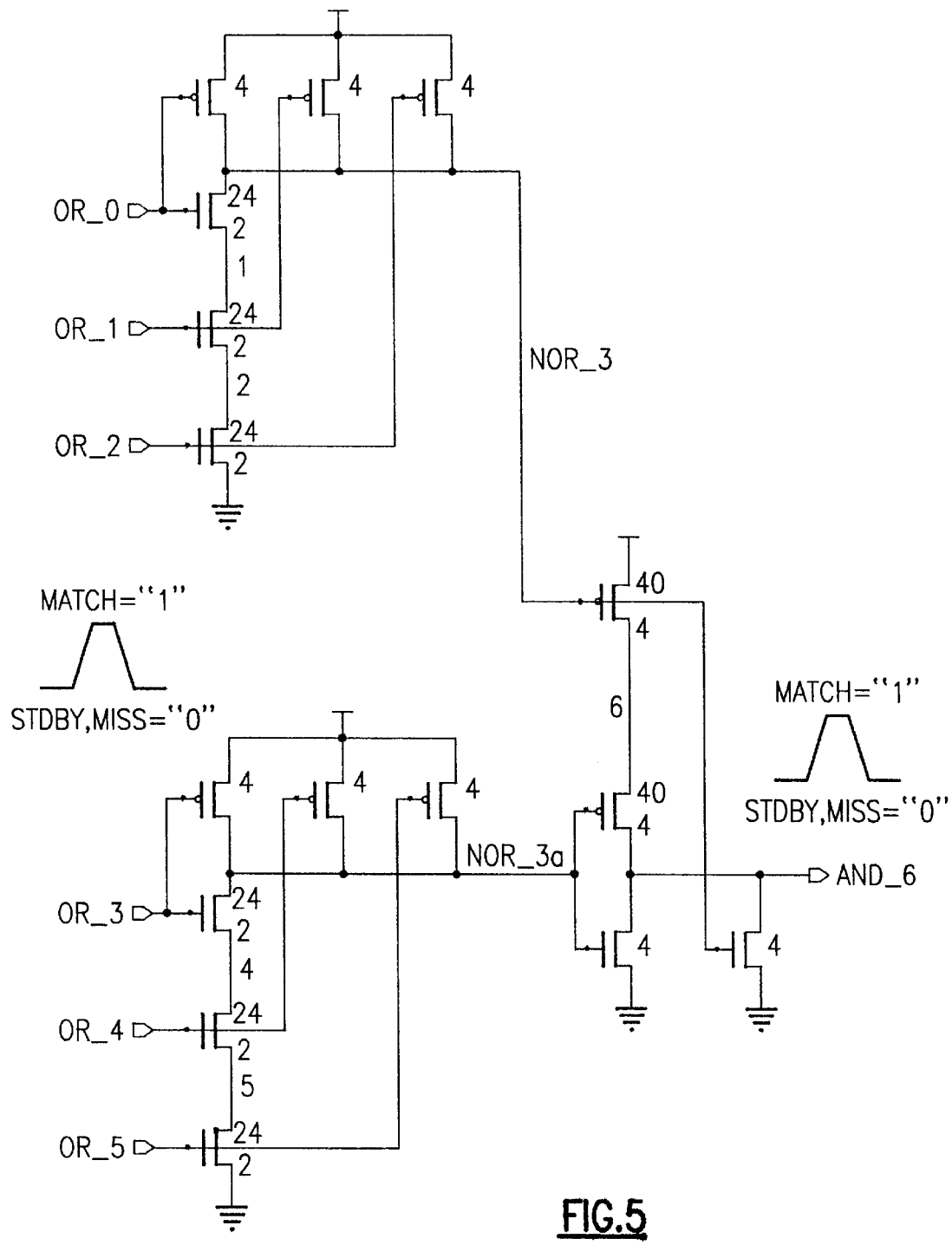
FIG. 5 shows a 6-way pseudo dynamic AND circuit.
Figure 6:
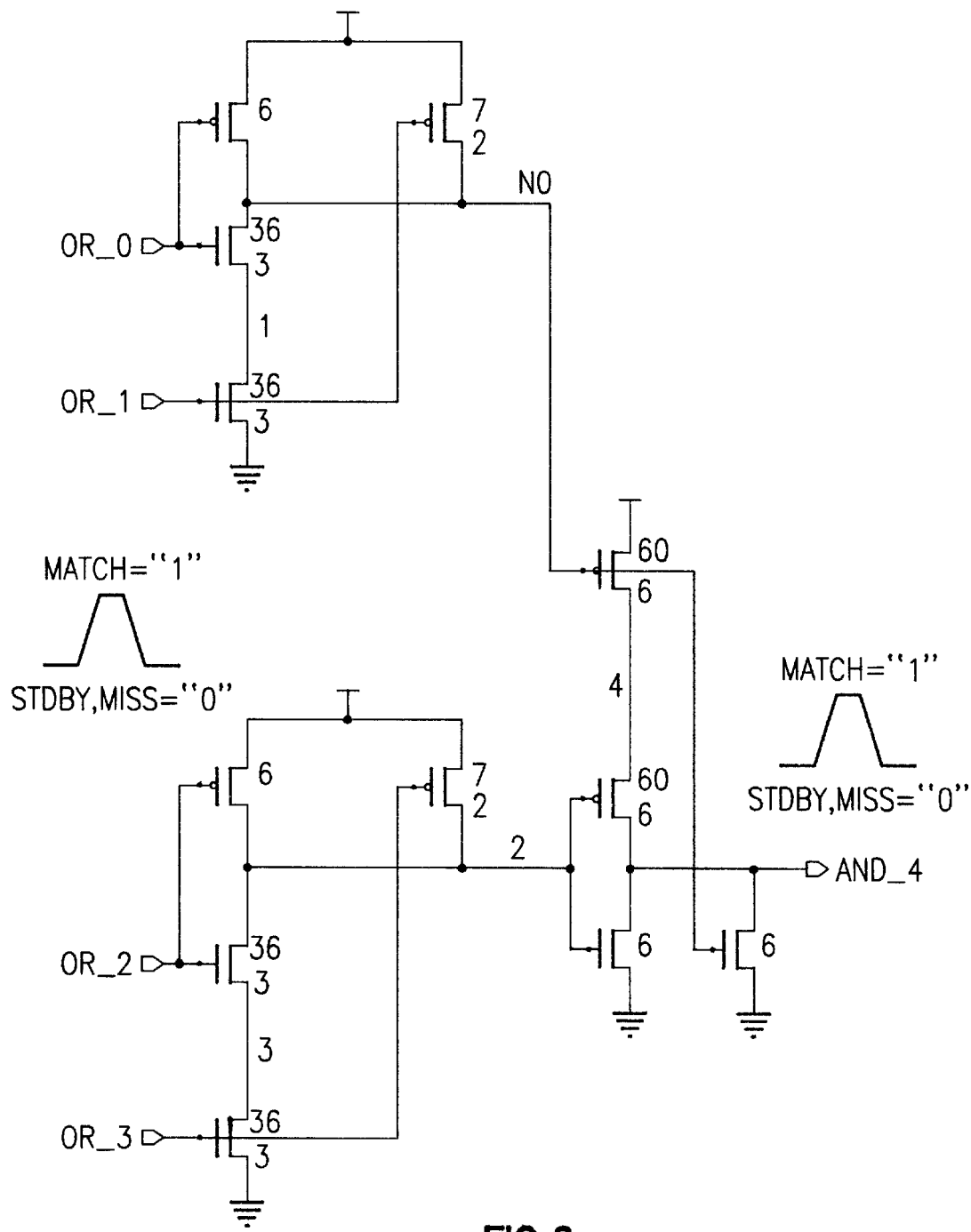
FIG. 6 illustrates a 4-way pseudo dynamic AND circuit.

FIG. 4 shows a dual-phase input pseudo dynamic XOR bit comparator and FIGS. 5, 6, and 7 show a 6-way AND, a 4-way AND and a 3-way pseudo dynamic AND circuit implementation for this invention. The PFET and NFET device ratio in these circuits have been skewed to provide very high leading edge performance.

Figure 8:
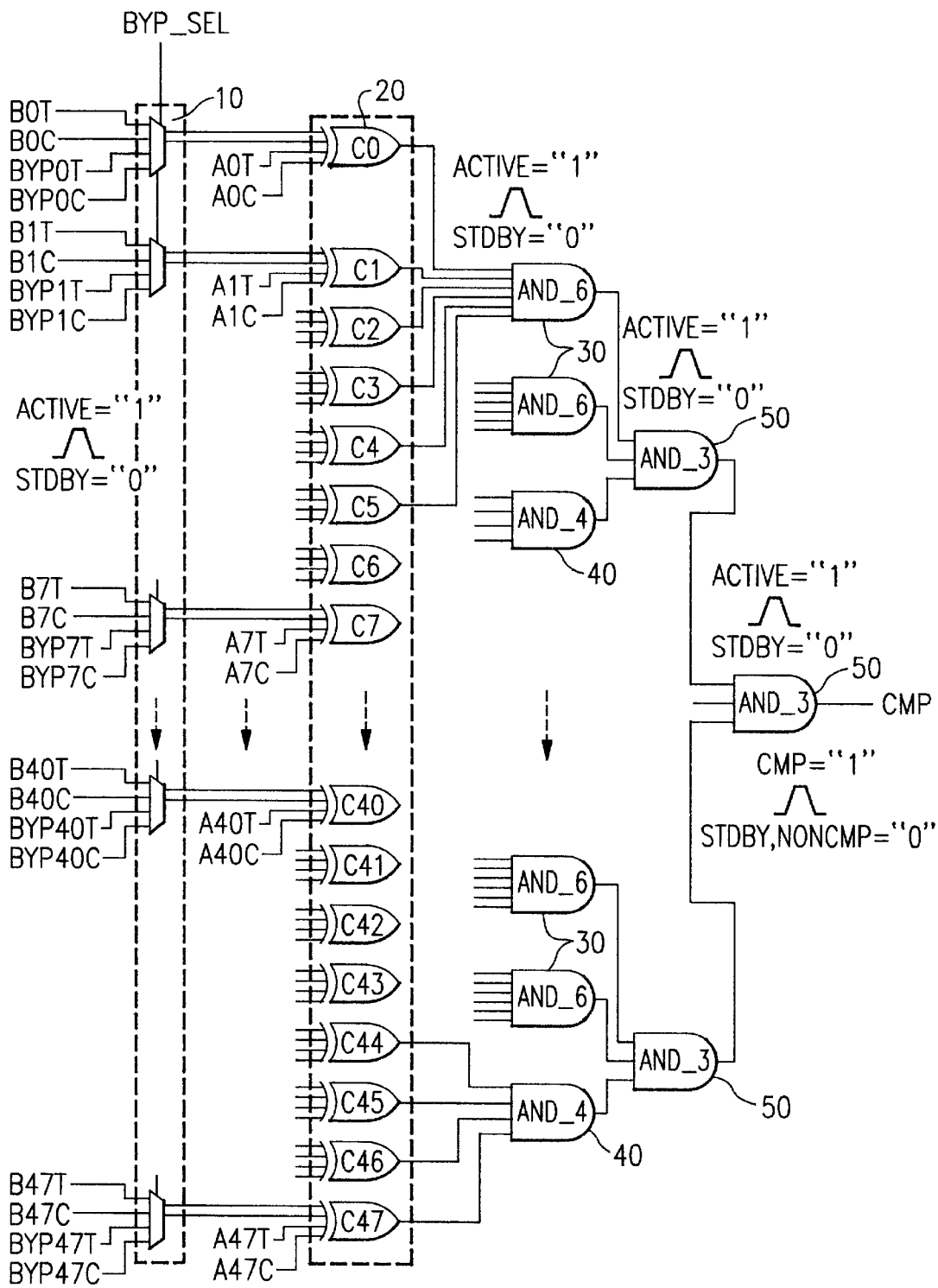
FIG. 8 illustrates a 48-bit comparator with bypass function.

FIG. 8 shows the functional diagram of a 48-bit pseudo dynamic comparator with bypass function. It consists of 48 dual-phase 2-input mux selectors(10) as the input logic stage, 48 dual-phase pseudo dynamic bit comparator(20) in the second stage, six 6-way AND circuits(30) and three 3-way AND circuits(40) in the third logic stage, three 3-way AND circuits(40) in the fourth logic stage, and a 3-way AND circuit(50) in the final logic stage. The input stage(10) performs multiplex data selection between the Set B inputs (B0T/B0C to B47T/B47C) and the Bypass inputs (Byp0T/Byp0C to Byp47T/Byp47C). This input selection is controlled by the byp_sel signal. When byp_sel is "0", Set B input is selected, if byp_sel is "1", the bypass input is selected instead. The second logic stage performs bit comparison between the Set A inputs (A0T/A0C to A47T/A47C) and the multiplexed data (Set B or Bypass). Outputs from the 48-bit comparators are then AND' ed together in the subsequent stages to form the final compare output CMP. When all the 48 bits are matched, CMP will be high (a logic "1"), if any one or more of the input bits are mismatched, CMP will remain low (or logic "0"). Elements 20, 30, 40 and 50 of FIG. 8 correspond to circuits shown in FIGS. 4, 5, 6 and 7 respectively. Element 10 is a typical 2-input mux selector that can be implemented with any static circuit style (example, 2 input pass-gate circuit). with this approach, since an input multiplexor circuit stage is added in front of the bit comparators to perform the bypass function, the path delay through this 48-bit comparator is therefore degraded.

Figure 9:
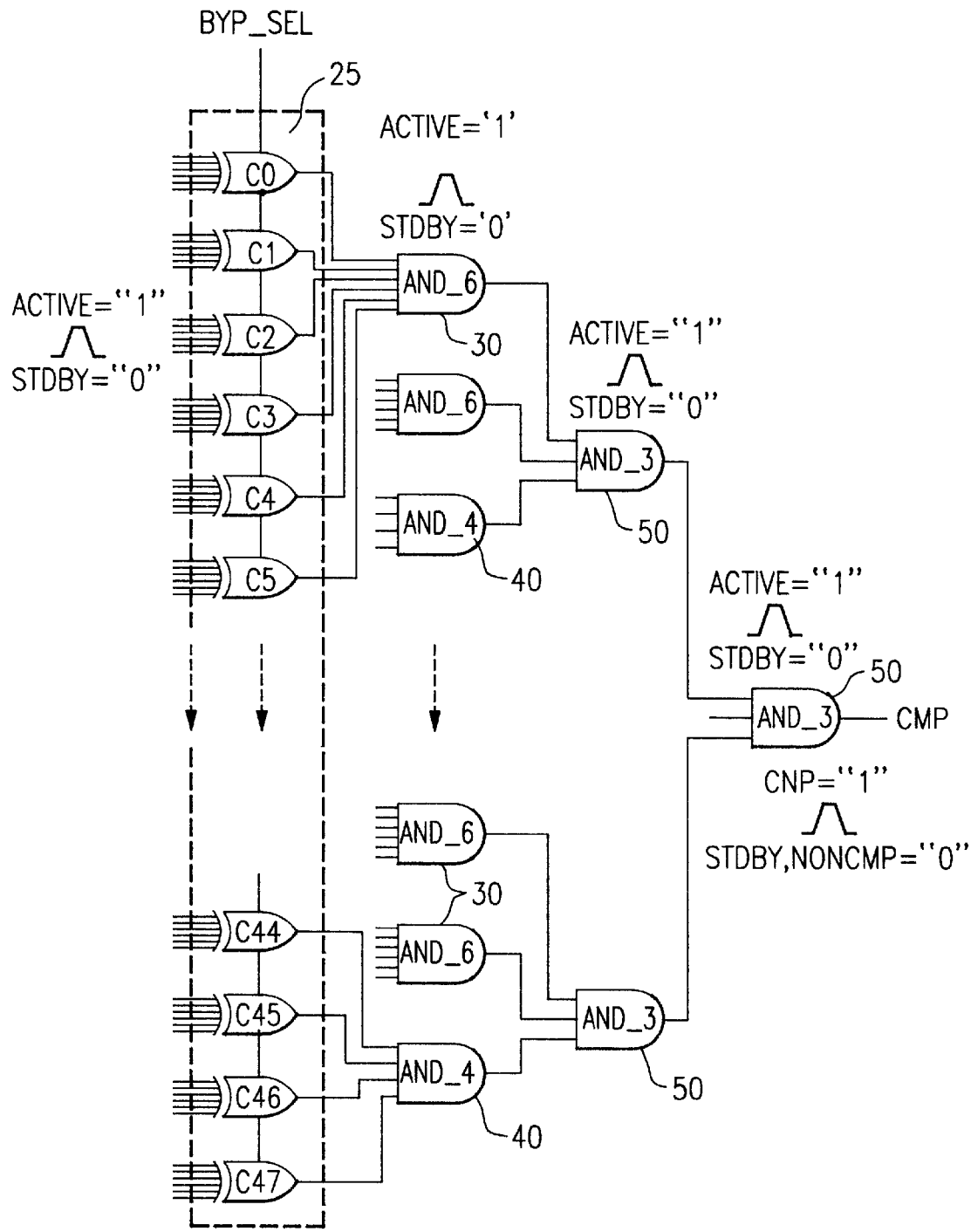
FIG. 9 illustrates the preferred embodiment of the high performance CMOS comparator with bypass function of the invention.

An improved 48-bit comparator with bypass function is shown in FIG. 9 illustrates the preferred embodiment. This invention shows a circuit technique that provides similar performance as the comparator in the above FIG. 3 but with the added and integrated bypass function (i.e. compare set A with set B or set A with bypass). Referring to FIG. 9, the bypass function is integrated in a new pseudo dynamic bit comparator(25), hence eliminating the separated multiplexor stage as in FIG. 8. With bypass function integrated in the exclusive-or circuits, we are able to achieve similar high performance speed as the above disclosure. Thus, in accordance with the invention, the preferred CMOS pseudo dynamic bit comparator circuit has an input logic stage which includes plurality of dual-phase multiple input multiplexer selectors integrated with a like plurality number of dual phase pseudo dynamic integrated bypass bit comparators which is coupled to a second logic stage. Furthermore, the circuit has at least two additional stages coupled to the first input logic stage. The second logic stage includes a plurality of logic circuits partitioned to fan-in fan-out levels which determine the number of stages of AND logic implemented in said second logic stage to provide an output of said second logic stage to a third logic stage, and more can be coupled in a similar manner to that previously described.

Thus, the third logic stage also includes a plurality of logic circuits partitioned to fan-in fan-out levels which determine the number of stages of logic implemented in said third logic stage to provide an output of said third logic stage, as to a fourth logic stage or other driven circuit.

The preferred embodiment of the CMOS pseudo dynamic bit comparator circuit provides for a set_A input and a set_B input of exclusive-or circuit which are both dynamic inputs, and the bypass inputs to the same exclusive-or circuit can be either static inputs or dynamic inputs as determined by coupled driving logic driving said first logic stage.

Figure 10:
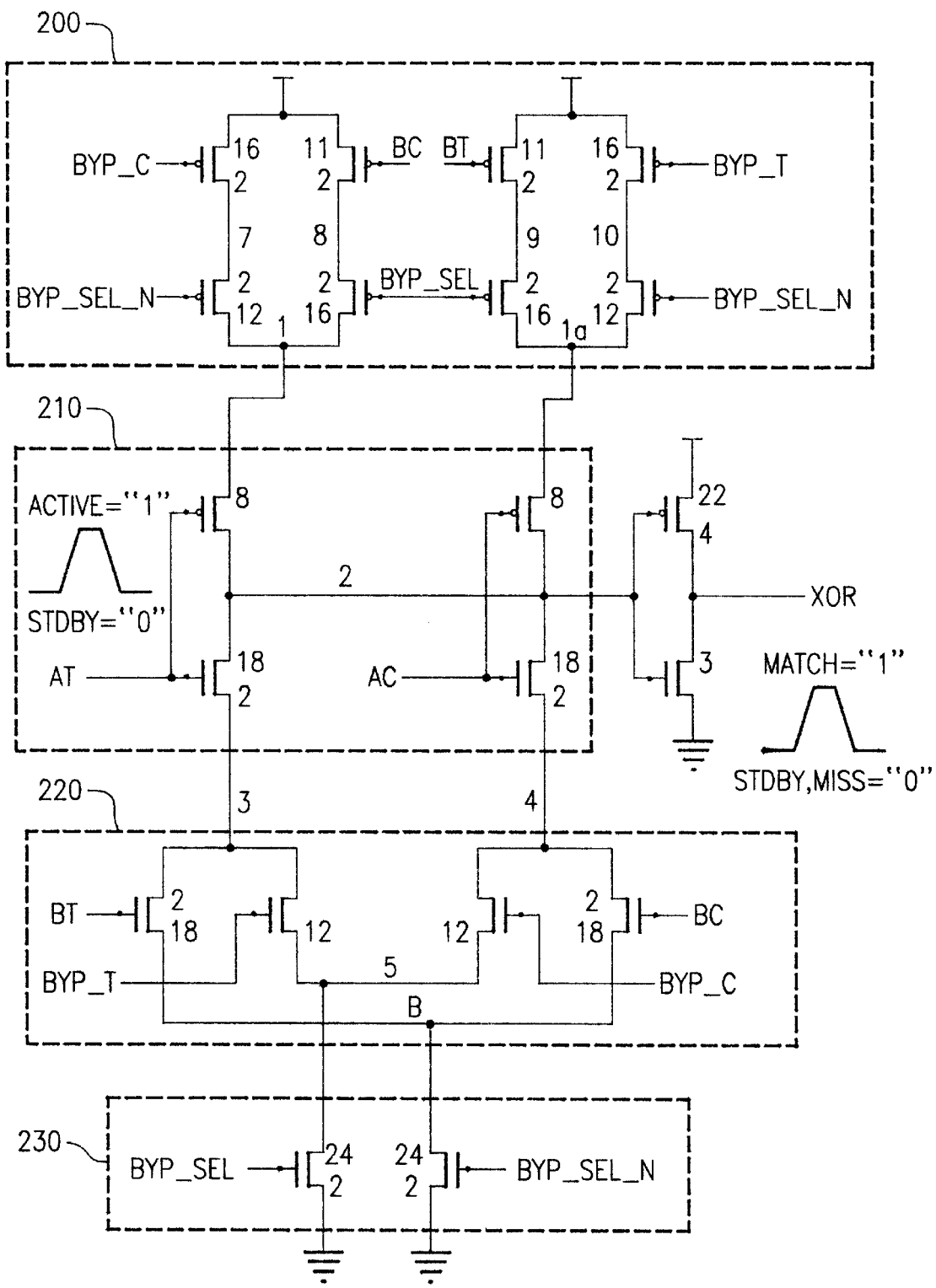
FIG. 10 illustrates the preferred embodiment of the invention for a pseudo dynamic bit comparator with an integrated bypass function for achieving high speed bit compare of two sets of data and of the first of the data sets with bypass data.

As illustrated by FIG. 10, the CMOS pseudo dynamic bit comparator circuit topology is implemented in stages, with the first logic stage implemented as four levels of logic. A first level 200 is provided for restoring the input logic stage to a standby state. A second level 210 of cascade logic for receiving the set_A input of the exclusive-or circuit. A third level 220 of cascade logic for receiving the set_B input and also the bypass input of the exclusive-or circuit. And a fourth level 230 of logic of the input logic stage implements the multiplexor selector function between set_B and bypass inputs.

FIG. 10 shows the implementation of the preferred embodiment of the invention in which the exclusive-or circuit is provided with an integrated bypass function. In this circuit bypass inputs (i.e. Byp_T, Byp_C, Byp_Sel, & Byp_Sel_N) could be either static or dynamic. If they are static then they must arrive earlier than the dynamic A inputs. If the bypass inputs are dynamic then we must insure that they arrive earlier than the dynamic inputs A & B and there is enough pulse overlap (300–700ps, technology dependent) between dynamic and bypass inputs.

In normal mode (Byp_sel ="0" and Byp_sel_N ="1"), device N9 is turned on to pull down node 6, the Set B input (BT,BC) is therefore selected. If both AT and BT are high, or both AC and BC are high, (ie, the inputs are matching), node 2 will be pull down and output XOR will rise to signify a compare. At the end of the cycle, both input Set A and Set B will fall to the standby level (since they are dynamic pulses), this will turn on the selected PFET devices of FIG. 10 to restore (pull up) node 2 to standby state, hence resetting the output XOR to a low level. In bypass mode (Byp_Sel ="1" and Byp_sel_N ="0"), node 5 gets pulled down by N8 to ground and the bypass input (Byp_T, Byp_C) is selected. The rest of the circuit will function the same as in the normal mode. With this circuit topology, since the bypass selection is done slightly ahead of time (ie, node 5 or node 6 is already down to activate the selected path before the Set A or Set B signals arrive), no performance is lost due to the added bypass function.

The remaining circuits of the comparator are same as the ones described in the above disclosure.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A CMOS pseudo dynamic bit comparator circuit, comprising:

an input logic stage including plurality of dual-phase multiple input multiplexer selectors integrated with a like plurality number of dual phase pseudo dynamic integrated bypass bit comparators which is coupled to a second logic stage; and said second logic stage including a plurality of exclusive-or circuits partitioned to fan-in fan-out levels which determine the number of stages of AND logic implemented in a third logic stage to provide an output of said second logic stage to said third logic stage;

said third logic stage including a plurality of logic circuits partitioned to fan-in fan-out levels which determine the number of stages of logic implemented in said third logic stage to provide an output of said third logic stage.

2. The CMOS pseudo dynamic bit comparator circuit according to claim 1, wherein said exclusive-or circuits having an external set_A input (A0T,A0C) and a multiplexed signal from one of set_B input (B0C,B0T) and bypass inputs (BYT0T, BYT0C) multiplexed from said first logic stage, wherein set_A and set_B inputs are respectively both dynamic inputs to said second logic stage and to said third logic stage, said bypass inputs are either static inputs or dynamic inputs but determined by coupled driving logic driving said first logic stage.

* * * * *